United States Patent [19]

Wesssells et al.

[11] 3,859,091

[45] Jan. 7, 1975

[54] PREPARATION OF PRINTING OR PATTERN PLATES

[75] Inventors: Forrest A. Wessells, Baltimore; John E. Pickard, Ellicott City, both of Md.

[73] Assignee: W. R. Grace & Co., New York, N.Y.

[22] Filed: Apr. 19, 1973

[21] Appl. No.: 352,510

Related U.S. Application Data

[63] Continuation-in-part of Ser. No. 351,415, April 16, 1973, abandoned, which is a continuation-in-part of Ser. No. 316,253, Dec. 18, 1972, abandoned, which is a continuation-in-part of Ser. No. 178,723, Sept. 8, 1971, abandoned.

[52] U.S. Cl. ........................ 96/36.3, 96/35.1, 96/38, 96/45

[51] Int. Cl. .......... C03c 5/00, G03f 7/00, G03f 5/00

[58] Field of Search ................ 96/35.1, 36.3, 45, 38

[56] References Cited

UNITED STATES PATENTS

| | | | |
|---|---|---|---|
| 2,760,863 | 8/1956 | Plambeck | 96/36.3 |
| 2,875,047 | 2/1959 | Oster | 96/35.1 |
| 3,144,331 | 8/1964 | Thommes | 96/35.1 |
| 3,249,436 | 5/1966 | Hapern | Halpern/45 |

*Primary Examiner*—David Klein
*Attorney, Agent, or Firm*—Charles L. Harness

[57] ABSTRACT

Process for forming printing plates or pattern plates including a layer of photocured liquid photocurable polymer on a support comprising first directly exposing said photocurable polymer layer to actinic radiation for a brief time and then further exposing the layer to actinic radiation through an image bearing transparency until the layer is substantially completely cured in the exposed image areas. Upon removal of the incompletely cured image nonexposed areas a developed relief printing plate is obtained.

4 Claims, No Drawings

PREPARATION OF PRINTING OR PATTERN PLATES

This application is a continuation-in-part of our prior copending application Ser. No. 351,415 filed Apr. 16, 1973 now abandoned, which is a continuation-in-part of our prior copending application Ser. No. 316,253, filed Dec. 18, 1972 and now abandoned, which is, in turn, a continuation-in-part of our copending Application Ser. No. 178,723, filed Sept. 8, 1971 and now abandoned.

This invention relates to preparation of polymeric printing plates. In particular it relates to a special technique for curing the liquid photocurable polymer layer of a polymeric printing plate prior to development of the plate by removal of incompletely cured areas.

In the printing art time is of the essence. In the past relief printing plates were usually made by photoengraving and etching a layer of zinc or magnesium metal. These old methods required a relatively long time for the preparation of a satisfactory relief printing plate. More recently the art has disclosed the use of polymeric materials as a substitute for metals in the formation of printing places. Photopolymerized or photocured printing elements are disclosed for example in Kitson — U.S. Pat. No. 3,129,098 (1964); Wessells et al. — U.S. Pat. No. 3,537,853 (1970) and Werber et al. — U.S. Pat. No. 3,615,450 (1971). Practical experience with the processes described in the said patents has shown that the time to polymerize or cure the polymeric printing layer prior to development of the final printing plates is still longer than desired in many applications. Another problem sometimes encountered in preparation of polymeric printing plates is the phenomenon known as "cupping" or "dishing." This phenonmenon, when it occurs, results in a concave characteristic in certain of the relief areas of relatively large size. Still another problem sometimes encountered in preparation of polymeric relief printing plates or of polymeric pattern plates or master plates (as disclosed and claimed for example in commonly assigned U.S. Pat. No. 3,666,461, dated 1972) is highlight dot instability wherein the highlight dots are not fully connected at the base and will erode away during printing; or are not properly carried over to the matrices or stereo plates made from the polymeric pattern plate.

It is an object of this invention to provide a method for producing polymeric printing plates in which the total curing or polymerization time is lessened in comparison with previously known methods. Another object of the invention is to provide a method for alleviating or reducing the cupping or dishing problems associated with previously known methods for preparing polymeric printing plates. Still another object of the invention is to alleviate or reduce highlight dot instability in polymeric relief printing plates and/or in polymeric pattern plates. Yet another object of the invention is to provide improved polymeric printing plates and improved polymeric pattern plates. Further objects and advantages of the present invention will become apparent to those skilled in the art in light of the following more detailed description.

It has been found that the foregoing and other objectives are attained if the curing stage or imaging stage in the production of polymeric printing plates is conducted in two distinct steps. In the first step the layer of photocurable polymer is directly exposed to actinic radiation for a brief period of time. Thereafter an image bearing transparency is interposed and the photocurable polymer is further exposed to actinic radiation through an image-bearing transparency until the photocurable polymer is substantially completely cured in the image exposed areas.

As stated, the direct exposure step is relatively brief. The minimum direct exposure time (herein sometimes referred to as "bump" exposure time) is that required to attain the desired reduction in cupping or dishing in large relief areas of the plate. The maximum bump exposure time is just less (e.g., about 10% less) than the exposure time at which the photopolymer begins to gel. Commencement of gelatin is readily apparent from visual observation of surface wrinkling of the polymer layer as the "skin" cures. Within these general parameters there will of course also be variations depending upon the particular photocurable composition employed, the type and intensity of the actinic radiation and other factors. When operating with the commercial LETTERFLEX systems and using commercially available LETTERFLEX photocurable compositions widely used throughout the United States it is typically found that excellent results are achieved when the direct exposure is continued for a period of from about 0.5 to about 4.0 seconds. Even very short bump exposure gives some improvement in reduced cupping or dishing. Optimum improvement in all respects (i.e., the greatest reduction in cupping and the greatest available increase in highlight dot stability) is achieved at the maximum bump exposure time. In practice this is typically determined by observing the time at which a sample of the photopolymer begins to gel under the prevailing exposure conditions and then setting the bump exposure time as a time which is about 10% or so less than the observed exposure time to commencement of gelation.

The subsequent imaging exposure (herein sometimes called the "main" exposure) step is continued until the image exposed portions of the photocurable composition are substantially completely cured. Again this will vary with the particular composition, type and intensity of the actinic radiation source and other like factors. Laboratory and field experience with the aforementioned commercial LETTERFLEX systems and commercial LETTERFLEX polymers has shown that there should be at least about 15 seconds, preferably about 20 to about 50 seconds, of main exposure for every one second of bump exposure. This means for bump exposures of 0.5 to 4.0 seconds that the main exposure will be at least about 7.5to 60 seconds and preferably 10 to 200 seconds, thus giving total exposures within the broad range of about 8 to about 204 seconds.

When operating in accordance with the present invention it is found that the combination of a brief direct bump exposure followed by the above specified train or imaging exposure reduces overall exposure or curing time to less than one-half and frequently to as low as one-third the exposure time required when all exposure is performed through an image-bearing transparency. Simultaneously the brief bump exposure reduces cupping or dishing to the point where it is virtually insignificant for all practical purposes. At the same time the highlight dot stability of the cured and developed relief printing plate or master plate is as good or better than that attainable in the previously practiced processes in which there is only one imaging step with all exposure through an image-bearing transparency.

Substantially any liquid photopolymer is operable in this invention. For example those described in U.S. Pat. Nos. 3,661,744 (1972); 3,676,195 (1972); 3,676,283 (1972); 3,697,395-7 (1972); 3,697,402 (1972); and 3,700,574 (1972) are useful. The nature of the photopolymer is not critical, so long as it will make a letterpress relief plate by providing cured areas and uncured areas. The latter areas are in all cases readily blown out by the air knife system claimed in U.S. Application Ser. No. 316,253; of which this application is a continuation-in-part.

Another suitable liquid photopolymer is prepared by mixing together 350 grams styrene, 650 grams of a typical unsaturated polyester resin, for example poly(ethylene maleate/phthalate), and is grams benzoin methyl ether as photoinitiator. Still another suitable liquid photopolymer is made by mixing 100 parts of diethylene glycol diacrylate and 1 part of benzoin as photoinitiator. Other liquid photopolymers are well known to those skilled in the art.

The photopolymer can aactually be a solid at the outset if it can be liquefied by warming (i.e., to a temperature in the range of 70°–200° Fahrenheit) to a viscosity in the range of 100 to 10,000 centipoises.

Our preferred photopolymer for use in this invention is the polyene-polythiol type described in U.S. Pat. No. 3,661,744. Such photopolymers, complete with photosensitizer (photocuring rate accelerator) are commercially available from W. R. Grace & Co. When polyene-polythiol photopolymers are referred to herein, it will be understood that those disclosed in the aforesaid patent are meant.

The following examples will aid in explaining, but should not be deemed as limiting, the instant invention. In all cases unless otherwise noted, all parts and percentages are by weight.

EXAMPLE 1

OPERATION OF THE INVENTION

Polymeric relief printing plates of the type that uses a liquid photopolymer have been described in great detail in patents owned by the assignee of the instant application, e.g., U.S. Pat. No. 3,615,450, Werber et al., issued Oct. 26, 1971. Polymeric master plates are described in commonly assigned U.S. Pat. No. 3,666,461, Kehr et al., issued May 30, 1972.

Examples of specific suitable photopolymers and their use in plate making are given below as Examples 2 and 3.

In processing the plate, it is necessary to go through the following steps:

1. Liquid photopolymer is spread out on a substrate to form a thin film.

2. This film of photopolymer on the substrate is then exposed to ultraviolet light first directly for a brief period of time (bump exposure) and then through an image, e.g., a photographic transparency. At this point, following procedures of the prior art, the incompletely cured polymer in the image nonexposure areas would be removed, typically in an etching bath. Preferably, however, it is removed by the air knife and blotting system described in the above-mentioned U.S. Application Ser. No. 316,253.

A convenient method of carrying out this invention is to first briefly and directly expose to actinic radiation and then to place an image-bearing, line or halftone, stencil or positive or negative transparency parallel to the surface of a layer of a photocurable (i.e., a photohardenable, photocrosslinkable, or photopolymerizable) composition ("photopolymer") which has been cast directly on a support. The image-bearing transparency and the surface of the composition may be in contact or have an air gap there between, as desired. The photocurable layer is then further exposed through the transparency to a source of actinic light, preferably a point or collimated light source, until the layer is substantially completely cured or polymerized to an insoluble stage in the image exposed areas. The thickness of the ultimate relief in such a method may be controlled by varying the thickness of the layer of the composition. Preferably there is a UV-post exposure of about 1 minute to harden the total relief image. The thus cured plate is then developed, e.g., subjected to a stream of air from an air knife to a degree necessary to remove incompletely cured polymer in the image nonexposed areas. Thereafter, the photocured printing plate is ready for use in printing, i.e., as a relief printing plate, or as described in U.S. Pat. No. 3,666,461, as a pattern to make other plates.

The following examples will aid in explaining the preparation of a specific photopolymer. All parts and percentages are by weight.

EXAMPLE 2

Tetraene prepared by reacting tolylene -2,4-diisocyanate with trimethylol propane diallyl ether, viz.:

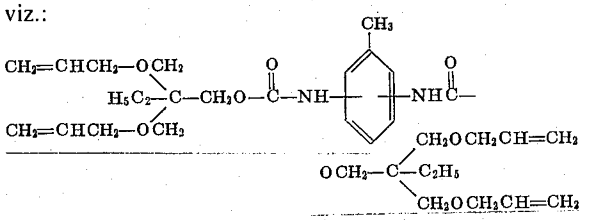

A round-bottom flask is fitted with a stirrer, thermometer, dropping funnel, nitrogen inlet and outlet. The flask can be placed in a heating mantle or immersed in a water bath as required.

Two moles (428 grams) of trimethylol propane diallyl ether were mixed with 0.2 cubic centimeters of dibutyl tin dilaurate under nitrogen. One mole of tolylene -2,4-diisocyanate was added to the mixture, using the rate of addition and cooling water to keep the temperature under 70° Centigrade. The mantle was used to keep the temperature at 70° Centigrade for another hour. Isocyanate analysis showed the reaction to be essentially complete at this time. An antioxidant, 0.6 grams of 2,6-di-tert-butyl-p-methylphenol was added to prevent vinyl polymerization.

EXAMPLE 3

One mole (602 grams) of the tetraene prepared by the procedure of Example 2 was mixed with one mole (488 grams) of pentaerythritol tetrakis-3-mercaptopropionate and 15 grams of benzophenone. This mixture when layered to the prescribed thickness, e.g., about 20 mils, cures very rapidly in ultraviolet light to give a hard, strong product. It makes excellent relief printing plates.

EXAMPLE 4

A plate suitable for air-etching is made in this Example.

The apparatus used in this run was a so-called "LETTERFLEX I Machine" sold commercially by W. R. Grace & Co. and in wide use in the United States. This machine includes several basic unit pieces of apparatus. The primary unit is the exposure tower. The exposure tower includes a platen, a glass frame negative holder, an ultra-violet ray source, and a system for dispensing the polymer and spreading it out by a doctor blade mechanism. The platen is an aluminum casting containing an indentation etched on its surface and connected to a vacuum source, for holding a plate on the platen, as later described. Underneath the platen is a heating means for example a bank of infra red lamps or a plurality of electrical heaters to insure that the platen is maintained at a constant temperature. The negative holder assembly comprises a sheet of Pyrex glass with a peripheral vacuum grid. The assembly may also include a transparent overlay sheet of clear plastic, which can be a polyester.

The negative is sandwiched in between the glass plate and the plastic overlay. The glass plate is carried in a metal frame. The negative carrier assembly is hinged in journals at its rear so that it can be lifted up for insertion of the negative, then lowered over the platen.

The first step is to insert the negative between the glass plate and the plastic overlay of the negative carrier. Secondly, the operator places the plate backing (which is sold commercially as a gold color aluminum sheet, ten mils thick) on the platen. This sheet has been treated with a conversion coating of a known type followed by a resin coating, for improved adherence of the ultimate coating of photopolymer described hereafter. To insure complete flatness of the negative within the plastic overlay, and to make contact with the glass plate, the operator may roll a squeegee over the surface of the negative assembly. He may perform a similar squeegee operation on the plate backing when it is placed on the platen. Independent vacuum systems operate to cause the negative to cling closely to the glass plate, and the aluminum plate backing to cling closely to the platen.

The actual holding means of the negative against the glass plate is the plastic overlay, which is itself held by the imposed vacuum.

The negative assembly, still in its upright position, now moves toward the operator. A series of dispensing nozzles in a linear tube at the front of the assembly now dispense photopolymer, for example, that mixture described in Example 3 above. A linear puddle of photopolymer is fairly precisely metered out. The negative assembly now moves back to its starting position, while simultaneously doctor blading the deposited puddle of photopolymer into a film having a uniform thickness of 20 to 23 mils (i.e., 0.020–0.023 inches), the thickness depending on the choice of the operator. The back strip is then removed. Protecting doors in the front of the assembly are now closed to protect the operator from the UV light which will now be turned on. Initially the plate is given a UV bump exposure in accordance with this invention and as is now customary in the LETTERFLEX trade, to eliminate the phenomenon known as cupping or dishing. The phenomenon, if permitted, results in a concave characteristic in certain of the larger relief letters. The use of the bump exposure prevents later development of this undesirable feature. As previously stated the bump exposure is typically about 0.5 to 4.0 seconds. The doors are now raised, and the operator hinges the negative assembly down on the platen containing the plate. At this point it must be observed that the negative assembly is not in contact with the photopolymer, which is to say, there is an air gap of 13–18 mils between the surface of the photopolymer and the bottom surface of the plastic overlay. This air gap is maintained by shims around the outer edge of the platen.

The doors are closed again, and the UV source turns on automatically for a predetermined time period (the main exposure), which depends upon the ultimate use intended for the printing plates. In a typical case, for newspaper plates, this main exposure is about 30–60 seconds.

The UV light is now turned off, the doors are raised, and the operator lifts the negative holding assembly. The resulting plate is now ready for development with the air knife in accordance with the process and apparatus of prior U.S. Application Ser. No. 316,253.

The above description is a summary, with minor modifications, of the apparatus and process described in U.S. Pat. No. 3,597,080. It is also possible when using the said apparatus, or the related automated apparatus of U.S. Pat. No. 3,635,711 to secure an appropriate source of actinic radiation to the dispensing and doctor blade assembly (best seen in FIGS. 2, 6–8 and 10–13 of U.S. Pat. No. 3,597,080 and in FIGS. 3, 4 and 7–9 of U.S. Pat. No. 3,635,711) so that bump exposure can be conducted at the same time as the photocurable composition is leveled by the doctor blade.

EXAMPLE 5

A series of four relief printing plates was prepared from the same batch of photocurable composition and in a substantially identical manner. In one run the curing stage was wholly conducted by exposure through an image-bearing transparency, using a high power xenon light source. In the other three runs there was an initial bump exposure without the transparency followed by a main or imaging exposure with the transparency — each using the same light source. Cupping was measured by cross-sectioning large characters, and then determining surface tolerance microscopically or with the use of photomicrographs. The results are summarized in the following Table I.

TABLE I

| Example No. | Bump Exposure (Pre-exposure) Time (Seconds) | Main (Imaging) Exposure Time (Seconds) | Surface Tolerance (Mils) |
|---|---|---|---|
| 5A | None | 150 | ± 1.5 |
| 5B | 2 | 40 | ± 0.25 |
| 5C | 0.8 | 58 | ± 0.35 |
| 5D | 1.6 | 56 | ± 0.25 |

EXAMPLE 6

A series of relief printing plates was prepared as in Example 5 to investigate the cupping phenomenon. No attempt was made to determine an optimum bump exposure/main exposure time ratio. The results are given in Table II.

TABLE II

| Example No. | Pre-exposure Time (Seconds) | Imaging Exposure Time | Surface Tolerance |
|---|---|---|---|
| 6A | None | 60 | ± 1.5 to 2.0 |
| 6B | 0.8 | 56 | ± 0.8 |
| 6C | 1.6 | 56 | ± 0.6 |

EXAMPLES 7-9

Experience has shown that the best bump exposure/-main exposure ratio appears to be about 20 to 50 seconds of main exposure for each second of bump exposure in order to attain good highlight (4 to 5 mils) dot stability. Thus, in evaluating one batch of commercially available LETTERFLEX photocurable polymer in laboratory equipment it was established that the optimum exposure conditions were 3.1 seconds of bump (or direct) exposure and 68 seconds main (or imaging) exposure. In these same evaluations it was found that a 228 second exposure time was required to achieve the same quality plate if all exposure was done through the image transparency.

In experimental work with two further batches of the aforesaid commercial LETTERFLEX photocurable compositions the optimum ratios were found to be 2 second bump and 40 second main exposure for one batch and 2¼ second bump with 48 second main exposure for the other batch. About 115–125 seconds of exposure had been required to achieve the same quality of printing plates when all exposure was done through the image transparency.

Subsequent work in the preparation of polymeric master plates in accordance, e.g., with the procedure detailed in U.S. Pat. No. 3,666,461 has revealed similar striking reductions in total required exposure times when the two step exposure method of this invention is employed.

It is to be understood that the above description is given merely by way of illustration and that many variations made be made without departing from the spirit of the present invention.

What is claimed is:

1. Method for making a polymeric relief printing plate with reduced cupping or dishing in large relief areas and increased highlight dot stability and with reduced overall cure time comprising the steps of:

a. disposing a substantially uniform layer of liquid photocurable polyene-polythiol polymer composition onto a support sheet;

b. curing the said layer by:

i. first directly exposing the layer of photocurable composition to actinic radiation for a time period of from about 0.5 to about 4.0 seconds, but not longer than about 10 percent less than the time period in which the photocurable polymer begins to gel when directly exposed under the prevailing exposure conditions;

ii. further exposing the layer of photocurable polymer composition to actinic radiation projected through an image-bearing transparency until the layer is substantially completely cured in the image exposed areas; and then c. developing the relief printing plate by removing from the support sheet the portions of incompletely cured photocurable polymer composition which were unexposed during said image exposure step (b) (ii).

2. Method of claim 1 wherein the image exposure step (b) (ii) is continued for at least about 15 seconds for each second of direct exposure in step (b) (i).

3. Method of claim 2 wherein the image exposure step (b) (ii) is continued for a time period equal to from about 20 to about 50 seconds for each second of direct exposure in step (b) (i).

4. Method of claim 3 in which the photopolymer layer is about 20 mils thick.

* * * * *